United States Patent
Chen et al.

(10) Patent No.: US 11,954,415 B2
(45) Date of Patent: Apr. 9, 2024

(54) EARLY WARNING METHOD FOR SAFETY PRODUCTION RISK OF TAILINGS POND BASED ON RISK RANKING

(71) Applicants: China Academy of Safety Science and Technology, Beijing (CN); Jiangxi Emergency Management Science Research Institute, Nanchang (CN)

(72) Inventors: Youliang Chen, Beijing (CN); Haigang Li, Nanchang (CN); Shigen Fu, Beijing (CN); Yanyu Chu, Beijing (CN); Qing Wang, Beijing (CN); Shouyin Wang, Beijing (CN); Zhentao Li, Beijing (CN); Yi Liu, Beijing (CN); Xiangliang Tian, Beijing (CN); Tao Chen, Beijing (CN); Jia Li, Beijing (CN); Xiaolong Zheng, Nanchang (CN); Pangfeng Guo, Beijing (CN); Shuang Chen, Beijing (CN)

(73) Assignees: China Academy of Safety Science and Technology, Beijing (CN); Jiangxi Emergency Management Science Research Institute, Nanchang (CN)

( * ) Notice: Subject to any disclaimer, the term of this patent is extended or adjusted under 35 U.S.C. 154(b) by 0 days.

(21) Appl. No.: 18/505,150

(22) Filed: Nov. 9, 2023

(65) Prior Publication Data
US 2024/0086589 A1  Mar. 14, 2024

Related U.S. Application Data

(63) Continuation of application No. PCT/CN2023/107383, filed on Jul. 14, 2023.

(30) Foreign Application Priority Data

Jul. 14, 2022 (CN) .......................... 202210829694.4

(51) Int. Cl.
*G06F 30/20* (2020.01)

(52) U.S. Cl.
CPC .................................... *G06F 30/20* (2020.01)

(58) Field of Classification Search
USPC ........................................................... 703/6
See application file for complete search history.

(56) References Cited

FOREIGN PATENT DOCUMENTS

| CN | 112116785 A | * 12/2020 | ............. G06F 17/11 |
|----|-------------|-----------|------------------------|
| CN | 113313387 A | 8/2021 | |

(Continued)

OTHER PUBLICATIONS

International Search Authority (CNIPA), Written Opinion by the International Search Authority for PCT/CN2023/107383, dated Oct. 19, 2023.

(Continued)

*Primary Examiner* — Mohammed Alam
(74) *Attorney, Agent, or Firm* — Zhigang Ma (57) ABSTRACT

An early warning method for safety production risk of tailings pond based on risk ranking is provided. The early warning method includes: monitoring and collecting internal basic data of a tailings pond in real-time, and performing a basic monitoring and a basic early warning; collecting geographical location data, meteorological data, and historical geological disaster data of an area where the tailings pond is located; performing risk ranking on a safety production risk of the tailings pond, thereby obtaining a risk level of the tailings pond; and collecting case data of global tailings pond accidents and hazard degree data thereof, acquiring accident solution strategies for the global tailings pond accidents, performing management and monitoring on the tailings pond, setting parameters in a process of the basic (Continued)

monitoring, and performing a ranked early warning on the safety production risk of the tailings pond based on the risk level.

8 Claims, 3 Drawing Sheets

(56) References Cited

FOREIGN PATENT DOCUMENTS

| | | | |
|---|---|---|---|
| CN | 114707222 A | * | 7/2022 |
| CN | 114781120 A | * | 7/2022 |

OTHER PUBLICATIONS

Claims of PCT/CN2023/107383, Jul. 14, 2023.

* cited by examiner

EARLY WARNING METHOD FOR SAFETY PRODUCTION RISK OF TAILINGS POND BASED ON RISK RANKING

TECHNICAL FIELD

The disclosure relates to the technical field of safety production monitoring, and particularly to an early warning method for safety production risk of tailings pond based on risk ranking.

BACKGROUND

Tailings pond is one of the important engineering construction contents of metal mining and beneficiation projects, and is a danger source of debris flow with high potential energy. At present, there are over ten thousand tailings with various sizes in China, which are characterized by wide distribution, large quantity, and poor stability. Once a dam break accident occurs, it will cause immeasurable losses to the lives and property of people in downstream areas, as well as bring many social problems such as environmental pollution and regional harmony. At present, many enterprises have equipped online safety monitoring systems for tailings ponds, the online safety monitoring systems for the tailings ponds mainly use automatic total stations combined with a fiber grating sensor networks to visually monitor main positions of the tailings pond. Corresponding monitoring indexes include key safety indexes of the tailings pond such as phreatic line, dam displacement, water level, dry beach length, and rainfall. These systems provide real data of production status of the tailings ponds for the enterprises, provide safety hazard data of the tailings ponds through report forms, and send early warning information to management personnel, which can provide certain assistance for enterprise safety management. However, the existing online safety monitoring systems for the tailings ponds have the following shortcomings.

(1) The monitoring systems mainly monitor the main indexes of the tailings pond, such as dam displacement, phreatic line, and water level. Other attributes in a safety index system of tailings pond, such as hazard level, regional hydrological and meteorological conditions, and geological conditions, are considered insufficiently, and a comprehensive quantitative model for safety monitoring of tailings pond is lacking.

(2) Most monitoring systems are applications installed locally and are each targeted at an individual tailings pond, which is not convenient for regulatory departments to monitor tailings ponds according to risk levels of tailings ponds. At the same time, monitoring-alarming and macro risk early warnings of tailings ponds cannot be performed with ranked early warning mechanisms.

SUMMARY

The disclosure provides an early warning method for safety production risk of tailings pond based on risk ranking, which is used to solve the problem of a weak risk early warning ability caused by insufficient data in existing tailings pond risk early warnings. The disclosure has the following technical solutions.

An embodiment of the disclosure provides an early warning method for safety production risk of tailings pond based on risk ranking, including:

monitoring and collecting internal basic data of a tailings pond in real-time; and performing a basic monitoring and a basic early warning based on the internal basic data of the tailings pond;

collecting geographical location data, meteorological data, and historical geological disaster data of an area where the tailings pond is located (also abbreviated as an area) in real-time; performing risk ranking on a safety production risk of the tailings pond based on the meteorological data and the historical geological disaster data, thereby obtaining a risk level of the tailings pond; and the risk level being one of a low risk level, a medium risk level, or a high risk level; and collecting case data of global tailings pond accidents and hazard degree data of the global tailings pond accidents, acquiring accident solution strategies for the global tailings pond accidents, performing management and monitoring on the tailings pond by combining the accident solution strategies with the risk level, setting parameters in a process of the basic monitoring based on the risk level, and performing a ranked early warning on the safety production risk of the tailings pond based on the risk level.

In an embodiment, the monitoring and collecting internal basic data of a tailings pond in real-time; and performing a basic monitoring and a basic early warning based on the internal basic data of the tailings pond includes:

collecting the internal basic data in real-time; the internal basic data includes a geological structure of the tailings pond, an operation status of the tailings pond, a flood discharge capacity of the tailings pond, a phreatic line of the tailings pond, a dry beach length (also referred to as a length of a dry beach) of the tailings pond, a water level of the tailings pond, and an external displacement of the tailings pond;

comparing each of the internal basic data of the tailings pond with a corresponding data threshold value; and performing the basic monitoring when a quantitative relationship between each of the internal basic data of the tailings pond and the corresponding data threshold value does not satisfy a preset safety monitoring relationship.

In an embodiment, the collecting geographical location data, meteorological data, and historical geological disaster data of an area where the tailings pond is located in real-time; performing risk ranking on a safety production risk of the tailings pond based on the meteorological data and the historical geological disaster data, thereby obtaining a risk level of the tailings pond; and the risk level being one of a low risk level, a medium risk level, or a high risk level includes:

monitoring and collecting the geographical location data, and acquiring a geographical location risk evaluation score by combining the geographical location data with a geographical location evaluation model;

monitoring and collecting the meteorological data, acquiring a meteorological risk evaluation score by combining the meteorological data with a meteorological evaluation model;

collecting the historical geological disaster data, and acquiring a geological disaster risk evaluation score by combining the historical geological disaster data with a geological disaster evaluation model; and combining the geographical location risk evaluation score, the meteorological risk evaluation score, and the geological disaster risk evaluation score to obtain the risk level being one of the low risk level, the medium risk level, or the high risk level.

In an embodiment, the monitoring and collecting the geographical location data, acquiring a geographical location risk evaluation score by combining the geographical location data with a geographical location evaluation model includes:

determining whether the area where the tailings pond is located is in an earthquake belt area through a survey, and collecting historical earthquake record data of the area where the tailings pond is located;

determining whether the area where the tailings pond is located is in a typhoon area through a survey, and collecting historical typhoon record data of the area where the tailings pond is located;

determining whether the area where the tailings pond is located is in a tsunami area through a survey, and collecting historical tsunami record data of the area where the tailings pond is located; and combining the historical earthquake record data, the historical typhoon record data, and the historical tsunami record data with the geographical location evaluation model to acquire the geographical location risk evaluation score.

Specifically, the geographical location evaluation model is as follows:

$$F_1 = P_1 \cdot \frac{n \cdot H_d \cdot J_d}{\sum_{i=1}^{n}(T_{i+1} - T_i)} + P_2 \cdot \frac{m \cdot H_t \cdot J_t}{\sum_{j=1}^{m}(T_{j+1} - T_j)} + P_3 \cdot \frac{q \cdot H_h \cdot J_h}{\sum_{k=1}^{q}(T_{k+1} - T_k)}$$

$$P_1 = \begin{cases} 1, & \text{the area belongs to the earthquake belt area} \\ 0.41, & \text{the area does not belong to the earthquake belt area} \end{cases}$$

$$P_2 = \begin{cases} 1, & \text{the area belongs to the typhoon area} \\ 0.28, & \text{the area does not belong to the typhoon area} \end{cases}$$

$$P_3 = \begin{cases} 1, & \text{the area belongs to the tsunami area} \\ 0.07, & \text{the area does not belong to the tsunami area} \end{cases}$$

where $F_1$ represents the geographical location risk evaluation score; $P_1$ represents an earthquake evaluation coefficient, $P_2$ represents a typhoon evaluation coefficient, and $P_3$ represents a tsunami evaluation coefficient; n represents the number of earthquakes occurring in the area, m represents the number of typhoons occurring in the area, and q represents the number of tsunamis occurring in the area; $H_d$ represents an average value of levels of the earthquakes occurring in the area, $H_t$ represents an average value of levels of the typhoons occurring in the area, and $H_h$ represents an average value of levels of the tsunamis occurring in the area; $J_d$ represents an average duration of the earthquakes occurring in the area, $J_t$ represents an average duration of the typhoons occurring in the area, and $J_h$ represents an average duration of the typhoons occurring in the area; $T_i$ represents an occurrence moment of an i-th earthquake, $T_{i+1}$ represents an occurrence moment of an i+1-th earthquake, $T_j$ represents an occurrence moment of a j-th typhoon, $T_{j+1}$ represents an occurrence moment of a j+1-th typhoon, $T_k$ represents an occurrence moment of a k-th tsunami, and $T_{k+1}$ represents an occurrence moment of a k+1-th tsunami.

In an embodiment, the monitoring and collecting the meteorological data, acquiring a meteorological risk evaluation score by combining the meteorological data with a meteorological evaluation model includes:

collecting historical rainfall data and continuous rainfall data in a preset time period; the preset time period is in a range of 12~18 months; and combining the historical rainfall data and the continuous rainfall data with the meteorological evaluation model to acquire the meteorological risk evaluation score.

Specifically, the meteorological evaluation model is as follows:

$$F_2 = \frac{C \cdot Y}{Y_0} + \frac{\sum_{i=1}^{e} Y_{ie}}{D}$$

where $F_2$ represents the meteorological risk evaluation score; C represents the number of rainfall events in a current year; Y represents a continuous rainfall of each of the rainfall events in the current year; $Y_0$ represents a preset rainfall reference; $Y_{ie}$ represents a total rainfall of an i-th month in a preset time period; E represents the number of months included in the preset time period; and D represents the total number of days in which the rainfall exceeds the rainfall reference in the preset time period.

In an embodiment, the collecting the historical geological disaster data, acquiring a geological disaster risk evaluation score by combining the historical geological disaster data with a geological disaster evaluation model includes:

setting a calibration area range for the collecting the historical geological disaster data in the area based on a current location of the area;

collecting the historical geological disaster data in the calibration area range; a geological disaster corresponding to the historical geological disaster data includes a flood, a mudslide, and a landslide; and combining the historical geological disaster data with the geological disaster evaluation model to acquire the geological disaster risk evaluation score.

Specifically, the geological disaster evaluation model is as follows:

$$F_3 = \frac{W+3}{W} \cdot \left( \frac{S_1}{L_1} \cdot T_1 \alpha_1 + \frac{S_2}{L_2} \cdot T_2 \alpha_2 + \frac{S_3}{L_3} \cdot T_3 \alpha_3 \right)$$

where W represents the number of types of geological disasters that occur in the calibration area range, except for the flood, the mudslide, and the landslide; $S_1$, $S_2$, and $S_3$ respectively represent area ranges affected by the flood, the mudslide, and the landslide; $L_1$ represents a shortest distance between a location of the flood and the location of the area, $L_2$ represents a shortest distance between a location of the mudslide and the location of the area, and $L_3$ represents a shortest distance between a location of the landslide and the location of the area. $\alpha_1$ represents a disaster evaluation coefficient corresponding to the flood, $\alpha_2$ represents a disaster evaluation coefficient corresponding to the mudslide, and $\alpha_3$ represents a disaster evaluation coefficient corresponding to the landslide. $T_1$ represents a preset area range of flood occurrence, $T_2$ represents a preset area range of mudslide occurrence, and $T_3$ represents a preset area range of landslide occurrence.

Specifically, a value range of the $\alpha_1$ is 0.22~0.39, a value range of the $\alpha_2$ is 0.17~0.26, and a value range of the $\alpha_3$ is 0.15~0.46. The value ranges of the disaster evaluation coefficients are set according to a geological environment of the area. The more similar the geological environment of the area is to a geological environment where the geological disasters can occur, the larger the disaster evaluation coefficients are set.

In an embodiment, the combining the geographical location risk evaluation score, the meteorological risk evaluation score, and the geological disaster risk evaluation score to obtain the risk level being one of the low risk level, the medium risk level, or the high risk level includes:

combining the geographical location risk evaluation score, the meteorological risk evaluation score, and the geological disaster risk evaluation score to acquire a comprehensive risk evaluation score;

comparing the comprehensive risk evaluation score with a first risk threshold value and a second risk threshold value;

determining the risk level of the tailings pond being the low risk level when the comprehensive risk evaluation score is not greater than the first risk threshold value;

determining the risk level of the tailings pond being the medium risk level when the comprehensive risk evaluation score is greater than the first risk threshold value and is not greater than the second risk threshold value; and determining the risk level of the tailings pond being the high risk level when the comprehensive risk evaluation score is greater than the second risk threshold value.

In an embodiment, a system for executing the early warning method for safety production risk of tailings pond based on risk ranking includes:

a basic data collection part, configured to monitor and collect the internal basic data of the tailings pond in real-time, and perform the basic monitoring and the basic early warning based on the internal basic data of the tailings pond;

an outer data collection part, configured to collect the geographical location data, the meteorological data, and the historical geological disaster data of the area where the tailings pond is located, and perform the risk ranking on the safety production risk of the tailings pond based on the meteorological data and the historical geological disaster data, thereby obtaining the risk level of the tailings pond; and the risk level being one of the low risk level, the medium risk level, or the high risk level; and a case collection part, configured to collect the case data of global tailings pond accidents and the hazard degree data of the global tailings pond accidents, acquire the accident solution strategies for the global tailings pond accidents, perform the management and the monitoring on the tailings pond based on the risk level, and perform the ranked early warning on the safety production risk of the tailings pond based on the risk level.

In an embodiment, the basic data collection part includes:

a data collection part, configured to collect the internal basic data in real-time; the internal basic data includes a geological structure of the tailings pond, an operation status of the tailings pond, a flood discharge capacity of the tailings pond, a phreatic line of the tailings pond, a dry beach length of the tailings pond, a water level of the tailings pond, and an external displacement of the tailings pond;

a comparison part, configured to compare each of the internal basic data of the tailings pond with a corresponding data threshold value; and a monitoring early warning part, configured to perform the basic monitoring when a quantitative relationship between each of the internal basic data of the tailings pond and the corresponding data threshold value does not satisfy a preset safety monitoring relationship.

In an embodiment, the outer data collection part includes:

a geographical location risk evaluation score acquiring part, configured to monitor and collect the geographical location data, and acquire the geographical location risk evaluation score by combining the geographical location data with the geographical location evaluation model;

a meteorological risk evaluation score acquiring part, configured to monitor and collect the meteorological data, acquire the meteorological risk evaluation score by combining the meteorological data with the meteorological evaluation model;

a geological disaster risk evaluation score acquiring part, configured to collect the historical geological disaster data, acquire the geological disaster risk evaluation score by combining the historical geological disaster data with the geological disaster evaluation model; and a risk level ranking part, configured to combine the geographical location risk evaluation score, the meteorological risk evaluation score, and the geological disaster risk evaluation score to obtain the risk level being one of the low risk level, the medium risk level, or the high risk level.

The disclosure has the following beneficial effects.

Compared with existing early warning methods for safety production risk of tailings pond, the early warning method for safety production risk of tailings pond based on risk ranking provided by the disclosure obtains a risk trend during an operation process of the tailings pond by combining the internal basic data of the tailings pond of an enterprise, safety inspection and hazard management, online monitoring of tailings pond data, enterprise information and reasons of occurring accidents of other enterprises, meteorological data, geological disaster data, and other uncontrollable factors. Especially, the meteorological data, the geological disaster data, and the uncontrollable factors are integrated into a process of the risk ranking, which improves rationality, scientificity, and accuracy of the risk ranking. Furthermore, the early warning is performed based on different risk levels, which can maximize the effectiveness of the early warning for safety production risk of the tailings pond.

DETAILED DESCRIPTION OF EMBODIMENTS

Exemplary embodiments of the disclosure are explained below in conjunction with drawings. It should be understood that the exemplary embodiments described here are only for the purpose of explaining and describing the disclosure and do not intend to limit the disclosure.

Figure 1:
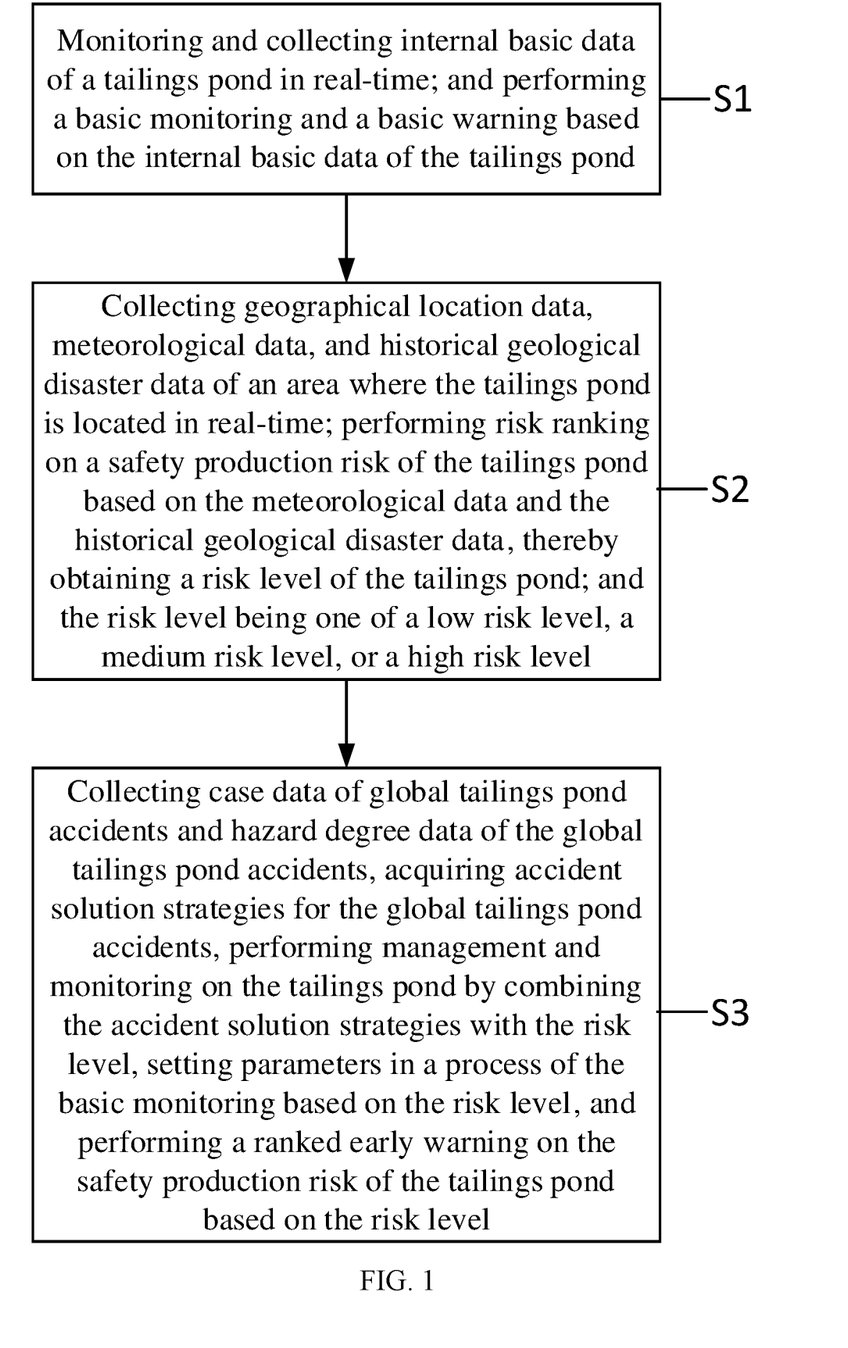
FIG. 1 is a flowchart of an early warning method for safety production risk of tailings pond based on risk ranking provided by the disclosure.

An early warning method for safety production risk of tailings pond based on risk ranking as shown in FIG. 1, the early warning method for safety production risk of tailings pond based on risk ranking includes:

step S1, monitoring and collecting internal basic data of a tailings pond in real-time; and performing a basic monitoring and a basic early warning based on the internal basic data of the tailings pond;

step S2, collecting geographical location data, meteorological data, and historical geological disaster data of an area where the tailings pond is located in real-time; performing risk ranking on a safety production risk of the tailings pond based on the meteorological data and the historical geological disaster data, thereby obtaining a risk level of the tailings pond; and the risk level being one of a low risk level, a medium risk level, or a high risk level; and step S3, collecting case data of global tailings pond accidents and hazard degree data of the global tailings pond accidents, acquiring accident solution strategies for the global tailings pond accidents, performing management and monitoring on the tailings pond by combining the accident solution strategies with the risk level, setting parameters in a process of the basic monitoring based on the risk level, and performing a ranked early warning (for example, issuing ranked early warning information) on the safety production risk of the tailings pond based on the risk level.

The working principle of the above technical solution includes: firstly, monitoring and collecting internal basic data of a tailings pond in real-time; and performing a basic monitoring and a basic early warning based on the internal basic data of the tailings pond; secondly, collecting geographical location data, meteorological data, and historical geological disaster data of an area where the tailings pond is located in real-time; performing risk ranking on a safety production risk of the tailings pond based on the meteorological data and the historical geological disaster data, thereby obtaining a risk level of the tailings pond; and the risk level being one of a low risk level, a medium risk level, or a high risk level; finally, collecting case data of global tailings pond accidents and hazard degree data of the global tailings pond accidents, acquiring accident solution strategies for the global tailings pond accidents, performing management and monitoring on the tailings pond by combining the accident solution strategies with the risk level, setting parameters in a process of the basic monitoring based on the risk level, and performing ranked early warning on the safety production risk of the tailings pond based on the risk level.

The above technical solution has the following beneficial effects. Compared with existing early warning methods for safety production risk of tailings pond, the early warning method for safety production risk of tailings pond based on risk ranking provided by the embodiment of the disclosure obtains a risk trend during a operation process of the tailings pond by combining the internal basic data of the tailings pond of an enterprise, safety inspection and hazard management, online monitoring of tailings pond data, enterprise information and reasons of occurring accidents of other enterprises, meteorological data, geological disaster data, and other uncontrollable factors. Especially, the meteorological data, the geological disaster data, and the uncontrollable factors are integrated into a process of the risk ranking, which improves rationality, scientificity, and accuracy of the risk ranking. Furthermore, the early warning is performed based on risk level, which can maximize the effectiveness of the early warning for safety production risk of the tailings pond.

In an embodiment of the disclosure, the monitoring and collecting internal basic data of a tailings pond in real-time; and performing a basic monitoring and a basic early warning based on the internal basic data of the tailings pond includes:

step S101, collecting the internal basic data in real-time; the internal basic data includes a geological structure of the tailings pond, a construction method of a dam of the tailings pond, an operation status of the tailings pond, a flood discharge capacity of the tailings pond, a phreatic line of the tailings pond, a dry beach length of the tailings pond, a water level of the tailings pond, and an external displacement of the tailings pond;

step S102, comparing each of the internal basic data of the tailings pond with a corresponding data threshold value; and step S103, performing the basic monitoring when a quantitative relationship between each of the internal basic data of the tailings pond and the corresponding data threshold value does not satisfy a preset safety monitoring relationship.

The working principle of the above technical solution includes: firstly, collecting the internal basic data in real-time; the internal basic data includes a geological structure of the tailings pond, a construction method of a dam of the tailings pond, an operation status of the tailings pond, a flood discharge capacity, a phreatic line of the tailings pond, a dry beach length of the tailings pond, a water level of the tailings pond, and an external displacement of the tailings pond; secondly, comparing each of the internal basic data of the tailings pond with a corresponding data threshold value; finally, performing the basic monitoring and the basic early warning when a quantitative relationship between each of the internal basic data of the tailings pond and the corresponding data threshold value does not satisfy a preset safety monitoring relationship.

The above technical solution has the following beneficial effects: Based on the above technical solution, the internal basic data of the tailings pond can be effectively collected. An independent safety monitoring and a corresponding early warning can be performed on production parts corresponding to the internal basic data. In the above technical solution, since the basic early warning and the ranked early warning can be independently analyzed, data used to obtain the ranked early warning can be effectively reduced, and the accuracy of risk ranking related to high risks can be further improved while the internal basic data is filtered out.

Figure 2:
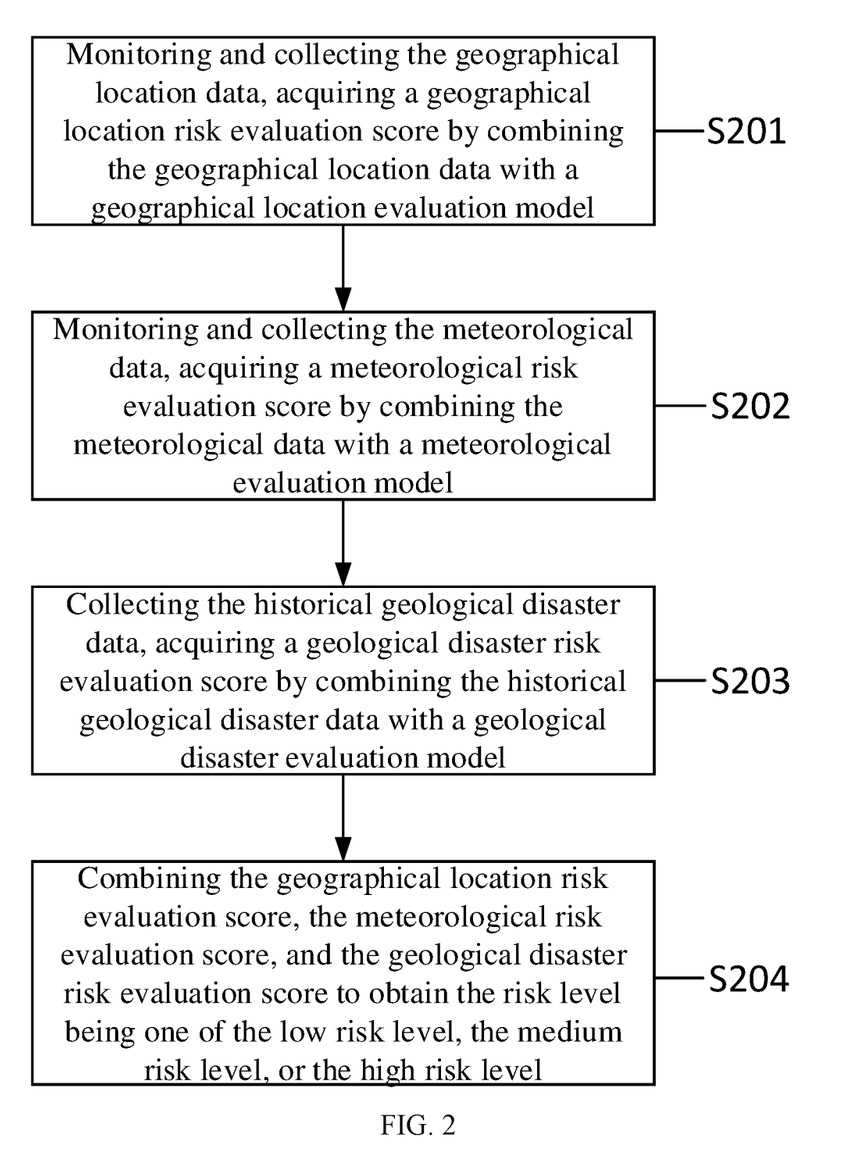
FIG. 2 is a flowchart of risk ranking of the early warning method for safety production risk of tailings pond based on risk ranking provided by the disclosure.

In an embodiment of the disclosure, as shown in FIG. 2, the collecting geographical location data, meteorological data, and historical geological disaster data of an area where the tailings pond is located in real-time; performing risk ranking on a safety production risk of the tailings pond based on the meteorological data and the historical geological disaster data, thereby obtaining a risk level of the tailings pond; and the risk level being one of a low risk level, a medium risk level, or a high risk level includes:

step S201, monitoring and collecting the geographical location data, acquiring a geographical location risk evaluation score by combining the geographical location data with a geographical location evaluation model;

step S202, monitoring and collecting the meteorological data, acquiring a meteorological risk evaluation score by combining the meteorological data with a meteorological evaluation model;

step S203, collecting the historical geological disaster data, acquiring a geological disaster risk evaluation score by combining the historical geological disaster data with a geological disaster evaluation model; and step S204, combining the geographical location risk evaluation score, the meteorological risk evaluation score, and the geological disaster risk evaluation score to obtain the risk level being one of the low risk level, the medium risk level, or the high risk level.

The working principle of the above technical solution includes: firstly, monitoring and collecting the geographical location data, acquiring a geographical location risk evaluation score by combining the geographical location data with a geographical location evaluation model; secondly, monitoring and collecting the meteorological data, acquiring a meteorological risk evaluation score by combining the meteorological data with a meteorological evaluation model; thirdly, collecting the historical geological disaster data, acquiring a geological disaster risk evaluation score by combining the historical geological disaster data with a geological disaster evaluation model; and finally, combining the geographical location risk evaluation score, the meteorological risk evaluation score, and the geological disaster risk evaluation score to obtain the risk level being one of the low risk level, the medium risk level, or the high risk level.

The above technical solution has the following beneficial effects: The meteorological data, the geological disaster data, and the uncontrollable factors are integrated into a process of the risk ranking, which improves rationality, scientificity, and accuracy of the risk ranking. Furthermore, the early warning is performed based on risk level, which can maximize the effectiveness of the early warning for safety production risk of the tailings pond.

In an embodiment of the disclosure, as shown in FIG. 2, the monitoring and collecting the geographical location data, acquiring a geographical location risk evaluation score by combining the geographical location data with a geographical location evaluation model includes:

step S2011, determining whether the area where the tailings pond is located is in an earthquake belt area through a survey, and collecting historical earthquake record data of the area where the tailings pond is located;

step S2012, determining whether the area where the tailings pond is located is in a typhoon area through a survey, and collecting historical typhoon record data of the area where the tailings pond is located;

step S2013, determining whether the area where the tailings pond is located is in a tsunami area through a survey, and collecting historical tsunami record data of the area where the tailings pond is located; and step S2014, combining the historical earthquake record data, the historical typhoon record data, and the historical tsunami record data with the geographical location evaluation model to acquire the geographical location risk evaluation score.

The geographical location evaluation model is as follows:

$$F_1 = P_1 \cdot \frac{n \cdot H_d \cdot J_d}{\sum_{i=1}^{n}(T_{i+1} - T_i)} + P_2 \cdot \frac{m \cdot H_t \cdot J_t}{\sum_{j=1}^{m}(T_{j+1} - T_j)} + P_3 \cdot \frac{q \cdot H_h \cdot J_h}{\sum_{k=1}^{q}(T_{k+1} - T_k)}$$

$$P_1 = \begin{cases} 1, & \text{the area belongs to the earthquake belt area} \\ 0.41, & \text{the area does not belong to the earthquake belt area} \end{cases}$$

$$P_2 = \begin{cases} 1, & \text{the area belongs to the typhoon area} \\ 0.28, & \text{the area does not belong to the typhoon area} \end{cases}$$

$$P_3 = \begin{cases} 1, & \text{the area belongs to the tsumani area} \\ 0.07, & \text{the area does not belong to the tsumani area} \end{cases}$$

where $F_1$ represents the geographical location risk evaluation score; $P_1$ represents an earthquake evaluation coefficient, $P_2$ represents a typhoon evaluation coefficient, and $P_3$ represents a tsunami evaluation coefficient; n represents the number of earthquakes occurring in the area, m represents the number of typhoons occurring in the area, and q represents the number of tsunamis occurring in the area; $H_d$ represents an average value of levels of the earthquakes occurring in the area, $H_t$ represents an average value of levels of the typhoons occurring in the area, and $H_h$ represents an average value of levels of the tsunamis occurring in the area; $J_d$ represents an average duration of the earthquakes occurring in the area, $J_t$ represents an average duration of the typhoons occurring in the area, and $J_h$ represents an average duration of the typhoons occurring in the area; $T_i$ represents an occurrence moment of an i-th earthquake, $T_{i+1}$ represents an occurrence moment of an i+1-th earthquake, $T_j$ represents an occurrence moment of a j-th typhoon, $T_{j+1}$ represents an occurrence moment of a j+1-th typhoon, $T_k$ represents an occurrence moment of a k-th tsunami, and $T_{k+1}$ represents an occurrence moment of a k+1-th tsunami.

The working principle of the above technical solution includes: firstly, determining whether the area where the tailings pond is located is in an earthquake belt area through a survey, and collecting historical earthquake record data of the area where the tailings pond is located; secondly, determining whether the area where the tailings pond is located is in a typhoon area through a survey, and collecting historical typhoon record data of the area where the tailings pond is located; thirdly, determining whether the area where the tailings pond is located is in a tsunami area through a survey, and collecting historical tsunami record data of the area where the tailings pond is located; and finally, combining the historical earthquake record data, the historical typhoon record data, and the historical tsunami record data with the geographical location evaluation model to acquire the geographical location risk evaluation score.

The above technical solution has the following beneficial effects: The geographical location data related to earthquakes, typhoons, tsunamis, and others is obtained based on the above technical solution, then the geographical location data combines with the geographical location evaluation model to obtain the geographical location risk evaluation score, data which includes the combination of earthquake, tsunamis, and typhoons can effectively improve the matching between geographical location risk evaluation and an actual geographical location of the tailings pond, thereby effectively improving the rationality and accuracy of the risk evaluation and subsequent risk ranking. At the same time, the geographical location risk evaluation score acquired based on the geographical location data can effectively match an actual building geographical location and environment of the tailings pond, and environmental data combined in the technical solution can take into account more risk factors, thereby improving the accuracy and practicality of the risk evaluation.

At the same time, since the geographical location risk evaluation score is obtained based on the geographical location evaluation model, the accuracy and rationality of the geographical location risk evaluation score can be effectively improved by setting a structure of the geographical location evaluation model and parameters of the geographical location evaluation model. Meanwhile, compared with traditional risk evaluation methods for tailings ponds, the embodiment adds the combination of various meteorological data, geological disaster data, and uncontrollable data. The addition of data leads to an increment in computational complexity. The geographical location evaluation model provided in the embodiment can effectively improve the accuracy and accuracy of evaluation, simplify a structure of the geographical location evaluation model in a case of data explosion, minimize the computational complexity, and effectively improve the evaluation efficiency of the risk ranking.

In an embodiment of the disclosure, the monitoring and collecting the meteorological data, acquiring a meteorological risk evaluation score by combining the meteorological data with a meteorological evaluation model includes:

step S2021, collecting historical rainfall data and continuous rainfall data in a preset time period; the preset time period is in a range of 12~18 months; and step S2022, combining the historical rainfall data and the continuous rainfall data with the meteorological evaluation model to acquire the meteorological risk evaluation score.

Specifically, the meteorological evaluation model is as follows:

$$F_2 = \frac{C \cdot Y}{Y_0} + \frac{\sum_{i=1}^{e} Y_{ie}}{D}$$

where $F_2$ represents the meteorological risk evaluation score; C represents the number of rainfall events in a current year; Y represents a continuous rainfall of each of the rainfall events in the current year; $Y_0$ represents a preset rainfall reference; $Y_{ie}$ represents a total rainfall of an i-th month in a preset time period; E represents the number of months included in the preset time period; and D represents the total number of days in which the rainfall exceeds the rainfall reference in the preset time period.

The working principle of the above technical solution includes: firstly, collecting historical rainfall data and continuous rainfall data in a preset time period; the preset time period is in a range of 12~18 months; then, combining the historical rainfall data and the continuous rainfall data with the meteorological evaluation model to acquire the meteorological risk evaluation score.

The above technical solution has the following beneficial effects: The historical rainfall data and the continuous rainfall data are obtained based on the above technical solution, then the historical rainfall data and the continuous rainfall data combine with the meteorological evaluation model to obtain the meteorological risk evaluation score, data which includes the combination of historical rainfall data and the continuous rainfall data can effectively improve the matching between meteorological risk evaluation and a meteorological environment corresponding to the actual geographical location of the tailings pond, thereby effectively improving the rationality and accuracy of the risk evaluation and subsequent risk ranking. At the same time, the meteorological risk evaluation score acquired based on the above meteorological data can effectively match an actual building geographical location and environment of the tailings pond, and environmental data combined in the technical solution can take into account more risk factors, thereby improving the accuracy and practicality of the risk evaluation.

At the same time, since the meteorological risk evaluation score is obtained based on the meteorological evaluation model, the accuracy and rationality of the meteorological risk evaluation score can be effectively improved by setting a structure of the meteorological evaluation model and parameters of the meteorological evaluation model. Meanwhile, compared with traditional risk evaluation methods for tailings ponds, the embodiment adds the combination of various meteorological data, geological disaster data, and uncontrollable data. The addition of data leads to an increment in computational complexity. The meteorological evaluation model provided in the embodiment can effectively improve the accuracy and accuracy of evaluation, simplify a structure of the meteorological evaluation model in a case of data explosion, minimize the computational complexity, and effectively improve the evaluation efficiency of the risk ranking.

In an embodiment of the disclosure, the collecting the historical geological disaster data, acquiring a geological disaster risk evaluation score by combining the historical geological disaster data with a geological disaster evaluation model includes:

step S2031, setting a calibration area range for the collecting the historical geological disaster data in the area based on a current location of the area;

step S2032, collecting the historical geological disaster data in the calibration area range; a geological disasters corresponding to the historical geological disaster data includes a flood, a mudslide, and a landslide; and step S2033, combining the historical geological disaster data with the geological disaster evaluation model to acquire the geological disaster risk evaluation score.

Specifically, the geological disaster evaluation model is as follows:

$$F_3 = \frac{W+3}{W} \cdot \left(\frac{S_1}{L_1} \cdot T_1\alpha_1 + \frac{S_2}{L_2} \cdot T_2\alpha_2 + \frac{S_3}{L_3} \cdot T_3\alpha_3\right)$$

where W represents the number of types of geological disasters that occur in the calibration area range, except for the flood, the mudslide, and the landslide; $S_1$, $S_2$, and $S_3$ respectively represent area ranges affected by the flood, the mudslide, and the landslide; $L_1$ represents a shortest distance between a location of the flood and the location of the area, $L_2$ represents a shortest distance between a location of the mudslide and the location of the area, and $L_3$ represents a shortest distance between a location of the landslide and the location of the area. $\alpha_1$ represents a disaster evaluation coefficient corresponding to the flood, $\alpha_2$ represents a disaster evaluation coefficient corresponding to the mudslide, and $\alpha_3$ represents a disaster evaluation coefficient corresponding to the landslide. $T_1$ represents a preset area range of flood occurrence, $T_2$ represents a preset area range of mudslide occurrence, and $T_3$ represents a preset area range of landslide occurrence. Specifically, a value range of the $\alpha_1$ is 0.22~0.39, a value range of the $\alpha_2$ is 0.17~0.26, and a value range of the $\alpha_3$ is 0.15~0.46. The value ranges of the disaster evaluation coefficients are set according to a geological environment of the area. The more similar the geological environment of the area is to a geological environment where the geological disasters can occur, the larger the disaster evaluation coefficients are set.

The working principle of the above technical solution includes: firstly, setting a calibration area range for the collecting the historical geological disaster data in the area based on a current location of the area; then collecting the historical geological disaster data in the calibration area range; a geological disaster corresponding to the historical geological disaster data includes a flood, a mudslide, and a landslide; and finally, combining the historical geological disaster data with the geological disaster evaluation model to acquire the geological disaster risk evaluation score.

The above technical solution has the following beneficial effects: The historical geological disaster data is obtained based on the above technical solution, then the historical geological disaster data combines with the geological disaster evaluation model to obtain the geological disaster risk evaluation score, data which includes the combination of the historical geological disaster data can effectively improve the matching between geological disaster risk evaluation and a geological environment corresponding to the actual geographical location of the tailings pond, thereby effectively improving the rationality and accuracy of the risk evaluation and subsequent risk ranking. At the same time, the risk evaluation score acquired based on the above historical geological disaster data can effectively match an actual building geographical location and environment of the tailings pond, and environmental data combined in the technical solution can take into account more risk factors, thereby improving the accuracy and practicality of the risk evaluation.

At the same time, since the geological disaster risk evaluation score is obtained based on the historical geological disaster data, the accuracy and rationality of the geological disaster risk evaluation score can be effectively improved by setting a structure of the geological disaster evaluation model and parameters of the geological disaster evaluation model. Meanwhile, compared with traditional risk evaluation methods for tailings ponds, the embodiment adds the combination of various meteorological data, geological disaster data, and uncontrollable data. The addition of data leads to an increment in computational complexity. The geographical disaster risk evaluation model provided in the embodiment can effectively improve the accuracy and accuracy of evaluation, simplify a structure of the geographical disaster risk evaluation model in a case of data explosion, minimize the computational complexity, and effectively improve the evaluation efficiency of the risk ranking.

In an embodiment of the disclosure, the combining the geographical location risk evaluation score, the meteorological risk evaluation score, and the geological disaster risk evaluation score to obtain the risk level being one of the low risk level, the medium risk level, or the high risk level includes:

step S2041, combining the geographical location risk evaluation score, the meteorological risk evaluation score, and the geological disaster risk evaluation score to acquire a comprehensive risk evaluation score;

step S2042, comparing the comprehensive risk evaluation score with a first risk threshold value and a second risk threshold value;

step S2043, determining the risk level of the tailings pond being the low risk level when the comprehensive risk evaluation score is not greater than the first risk threshold value;

step S2044, determining the risk level of the tailings pond being the medium risk level when the comprehensive risk evaluation score is greater than the first risk threshold value and is not greater than the second risk threshold value; and step S2045, determining the risk level of the tailings pond being the high risk level when the comprehensive risk evaluation score is greater than the second risk threshold value.

The working principle of the above technical solution includes: firstly, combining the geographical location risk evaluation score, the meteorological risk evaluation score, and the geological disaster risk evaluation score to acquire a comprehensive risk evaluation score; secondly, comparing the comprehensive risk evaluation score with a first risk threshold value and a second risk threshold value; thirdly, determining the risk level of the tailings pond being the low risk level when the comprehensive risk evaluation score is not greater than the first risk threshold value; fourthly, determining the risk level of the tailings pond being the medium risk level when the comprehensive risk evaluation score is greater than the first risk threshold value and is not greater than the second risk threshold value; and finally, determining the risk level of the tailings pond being the high risk level when the comprehensive risk evaluation score is greater than the second risk threshold value.

The above technical solution has the following beneficial effects: the above technical solution can effectively improve the ranking efficiency of risk ranking and the rationality of the risk ranking.

Figure 3:
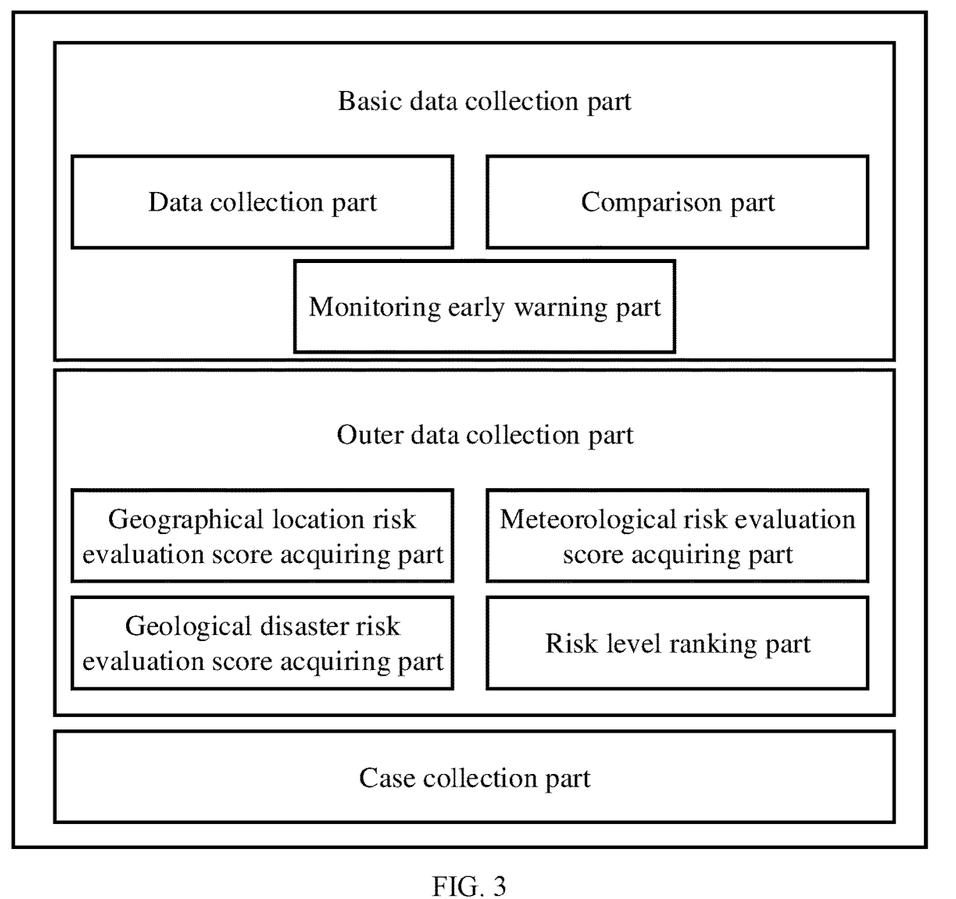
FIG. 3 is a block diagram of a system for executing the early warning method for safety production risk of tailings pond based on risk ranking provided by the disclosure.

In an embodiment of the disclosure, as shown in FIG. 3, a system for executing the early warning method for safety production risk of tailings pond based on risk ranking includes:

a basic data collection part, configured to monitor and collect the internal basic data of the tailings pond in real-time, and perform the basic monitoring and the basic early warning based on the internal basic data of the tailings pond;

an outer data collection part, configured to collect the geographical location data, the meteorological data, and the historical geological disaster data of the area where the tailings pond is located, and perform the risk ranking on the safety production risk of the tailings pond based on the meteorological data and the historical geological disaster data, thereby obtaining the risk level of the tailings pond; and the risk level being one of the low risk level, the medium risk level, or the high risk level; and a case collection part, configured to collect the case data of global tailings pond accidents and the hazard degree data of the global tailings pond accidents, acquire the accident solution strategies for the global tailings pond accidents, perform the management and the monitoring on the tailings pond based on the risk level, and perform the ranked early warning on the safety production risk of the tailings pond based on the risk level.

Specifically, the basic data collection part includes:

a data collection part, configured to collect the internal basic data in real-time; the internal basic data includes a geological structure of the tailings pond, an operation status of the tailings pond, a flood discharge capacity of the tailings pond, a phreatic line of the tailings pond, a dry beach length of the tailings pond, a water level of the tailings pond, and an external displacement of the tailings pond;

a comparison part, configured to compare each of the internal basic data of the tailings pond with a corresponding data threshold value; and a monitoring early warning part, configured to perform the basic monitoring when a quantitative relationship between each of the internal basic data of the tailings pond and the corresponding data threshold value does not satisfy a preset safety monitoring relationship.

Specifically, the outer data collection part includes:

a geographical location risk evaluation score acquiring part, configured to monitor and collect the geographical location data, and acquire the geographical location risk evaluation score by combining the geographical location data with the geographical location evaluation model;

a meteorological risk evaluation score acquiring part, configured to monitor and collect the meteorological data, acquire the meteorological risk evaluation score by combining the meteorological data with the meteorological evaluation model;

a geological disaster risk evaluation score acquiring part, configured to collect the historical geological disaster data, acquire the geological disaster risk evaluation score by combining the historical geological disaster data with the geological disaster evaluation model; and a risk level ranking part, configured to combine the geographical location risk evaluation score, the meteorological risk evaluation score, and the geological disaster risk evaluation score to obtain the risk level being one of the low risk level, the medium risk level, or the high risk level.

The above technical solution has the following beneficial effects.

Compared with existing early warning methods for safety production risk of tailings pond, the early warning method for safety production risk of tailings pond based on risk ranking provided by the disclosure obtains a risk trend during an operation process of the tailings pond by combining the internal basic data of the tailings pond of an enterprise, safety inspection and hazard management, online monitoring of tailings pond data, enterprise information and reasons of occurring accidents of other enterprises, meteorological data, geological disaster data, and other uncontrollable factors. Especially, the meteorological data, the geological disaster data, and the uncontrollable factors are integrated into a process of the risk ranking, which improves rationality, scientificity, and accuracy of the risk ranking. Furthermore, the early warning is performed based on risk level, which can maximize the effectiveness of the early warning for safety production risk of the tailings pond.

In an embodiment, the early warning method for safety production risk of tailings pond based on risk ranking further includes: presenting the risk level to a regulatory department, and thereby supervising, by the regulatory department, the tailings pond based on the risk level.

Further, in an embodiment, the early warning method for safety production risk of tailings pond based on risk ranking is implemented by an early warning device including a processor and a memory with an early warning application stored therein. The early warning application, when executed by the processor, is configured to implement the early warning method for safety production risk of tailings pond based on risk ranking and is further configured to send, over the Internet, the risk level to a mobile terminal of management personnel of a regulatory department. An application installed in the mobile terminal is configured to receive the risk level, and display the risk level on the mobile terminal to assist the management personnel to perform enterprise safety management.

Apparently, those skilled in the art can make various modifications and variations to the disclosure without departing from the spirit and scope of the disclosure. In this way, if these modifications and variations of the disclosure fall within the scope of the claims and their equivalents, the disclosure is also intended to include these modifications and variations.

What is claimed is:

1. An early warning method for safety production risk of tailings pond based on risk ranking, comprising:

monitoring and collecting internal basic data of a tailings pond in real-time; and performing a basic monitoring and a basic early warning based on the internal basic data of the tailings pond;

collecting geographical location data, meteorological data, and historical geological disaster data of an area where the tailings pond is located in real-time; performing risk ranking on a safety production risk of the tailings pond based on the meteorological data and the historical geological disaster data, thereby obtaining a risk level of the tailings pond; and the risk level being one of a low risk level, a medium risk level, or a high risk level; and collecting case data of global tailings pond accidents and hazard degree data of the global tailings pond accidents, acquiring accident solution strategies for the global tailings pond accidents, performing management and monitoring on the tailings pond by combining the accident solution strategies with the risk level, setting parameters in a process of the basic monitoring based on the risk level, and performing a ranked early warning on the safety production risk of the tailings pond based on the risk level;

wherein the collecting geographical location data, meteorological data, and historical geological disaster data of an area where the tailings pond is located in real-time; performing risk ranking on a safety production risk of the tailings pond based on the meteorological data and the historical geological disaster data, thereby obtaining a risk level of the tailings pond; and the risk level being one of a low risk level, a medium risk level, or a high risk level comprises:

monitoring and collecting the geographical location data of the area where the tailings pond is located, and acquiring a geographical location risk evaluation score by combining the geographical location data with a geographical location evaluation model;

monitoring and collecting the meteorological data of the area where the tailings pond is located, and acquiring a meteorological risk evaluation score by combining the meteorological data with a meteorological evaluation model;

collecting the historical geological disaster data of the area where the tailings pond is located, and acquiring a geological disaster risk evaluation score by combining the historical geological disaster data with a geological disaster evaluation model; and combining the geographical location risk evaluation score, the meteorological risk evaluation score, and the geological disaster risk evaluation score to obtain the risk level being one of the low risk level, the medium risk level, or the high risk level;

wherein the monitoring and collecting the geographical location data of the area where the tailings pond is located, and acquiring a geographical location risk evaluation score by combining the geographical location data with a geographical location evaluation model comprises:

determining whether the area where the tailings pond is located is in an earthquake belt area through a survey, and collecting historical earthquake record data of the area where the tailings pond is located;

determining whether the area where the tailings pond is located is in a typhoon area through a survey, and collecting historical typhoon record data of the area where the tailings pond is located;

determining whether the area where the tailings pond is located is in a tsunami area through a survey, and collecting historical tsunami record data of the area where the tailings pond is located; and combining the historical earthquake record data, the historical typhoon record data, and the historical tsunami record data with the geographical location evaluation model to acquire the geographical location risk evaluation score;

wherein the geographical location evaluation model is as follows:

$$F_1 = P_1 \cdot \frac{n \cdot H_d \cdot J_d}{\sum_{i=1}^{n}(T_{i+1} - T_i)} + P_2 \cdot \frac{m \cdot H_t \cdot J_t}{\sum_{j=1}^{m}(T_{j+1} - T_j)} + P_3 \cdot \frac{q \cdot H_h \cdot J_h}{\sum_{k=1}^{q}(T_{k+1} - T_k)}$$

$$P_1 = \begin{cases} 1, & \text{the area belongs to the earthquake belt area} \\ 0.41, & \text{the area does not belong to the earthquake belt area} \end{cases}$$

$$P_2 = \begin{cases} 1, & \text{the area belongs to the typhoon area} \\ 0.28, & \text{the area does not belong to the typhoon area} \end{cases}$$

$$P_3 = \begin{cases} 1, & \text{the area belongs to the tsunami area} \\ 0.07, & \text{the area does not belong to the tsunami area} \end{cases}$$

where $F_1$ represents the geographical location risk evaluation score; $P_1$ represents an earthquake evaluation coefficient, $P_2$ represents a typhoon evaluation coefficient, and $P_3$ represents a tsunami evaluation coefficient; n represents the number of earthquakes occurring in the area, m represents the number of typhoons occurring in the area, and q represents the number of tsunamis occurring in the area; $H_d$ represents an average value of levels of the earthquakes occurring in the area, $H_t$ represents an average value of levels of the typhoons occurring in the area, and $H_h$ represents an average value of levels of the tsunamis occurring in the area; $J_d$ represents an average duration of the earthquakes occurring in the area, $J_t$ represents an average duration of the typhoons occurring in the area, and $J_h$ represents an average duration of the typhoons occurring in the area; $T_i$ represents an occurrence moment of an i-th earthquake, $T_{i+1}$ represents an occurrence moment of an i+1-th earthquake, $T_j$ represents an occurrence moment of a j-th typhoon, $T_{j+1}$ represents an occurrence moment of a j+1-th typhoon, $T_k$ represents an occurrence moment of a k-th tsunami, and $T_{k+1}$ represents an occurrence moment of a k+1-th tsunami.

2. The early warning method for safety production risk of tailings pond based on risk ranking as claimed in claim 1, wherein the monitoring and collecting internal basic data of a tailings pond in real-time; and performing a basic monitoring and a basic early warning based on the internal basic data of the tailings pond comprises:

collecting the internal basic data in real-time; wherein the internal basic data comprises a geological structure of the tailings pond, an operation status of the tailings pond, a flood discharge capacity of the tailings pond, a phreatic line of the tailings pond, a dry beach length of the tailings pond, a water level of the tailings pond, and an external displacement of the tailings pond;

comparing each of the internal basic data of the tailings pond with a corresponding data threshold value; and performing the basic monitoring and the basic early warning when a quantitative relationship between each of the internal basic data of the tailings pond and the corresponding data threshold value does not satisfy a preset safety monitoring relationship.

3. The early warning method for safety production risk of tailings pond based on risk ranking as claimed in claim 1, wherein the monitoring and collecting the meteorological data of the area where the tailings pond is located, and acquiring a meteorological risk evaluation score by combining the meteorological data with a meteorological evaluation model comprises:

collecting historical rainfall data and continuous rainfall data in a preset time period; wherein the preset time period is in a range of 12~18 months; and combining the historical rainfall data and the continuous rainfall data with the meteorological evaluation model to acquire the meteorological risk evaluation score.

4. The early warning method for safety production risk of tailings pond based on risk ranking as claimed in claim 1, wherein the collecting the historical geological disaster data of the area where the tailings pond is located, and acquiring a geological disaster risk evaluation score by combining the historical geological disaster data with a geological disaster evaluation model comprises:

setting a calibration area range for the collecting the historical geological disaster data in the area based on a location of the area;

collecting the historical geological disaster data in the calibration area range; wherein a geological disaster corresponding to the historical geological disaster data comprises a flood, a mudslide, and a landslide; and combining the historical geological disaster data with the geological disaster evaluation model to acquire the geological disaster risk evaluation score.

5. The early warning method for safety production risk of tailings pond based on risk ranking as claimed in claim 1, wherein the combining the geographical location risk evaluation score, the meteorological risk evaluation score, and the geological disaster risk evaluation score to obtain the risk level being one of the low risk level, the medium risk level, or the high risk level comprises:

combining the geographical location risk evaluation score, the meteorological risk evaluation score, and the geological disaster risk evaluation score to acquire a comprehensive risk evaluation score;

comparing the comprehensive risk evaluation score with a first risk threshold value and a second risk threshold value;

determining the risk level of the tailings pond being the low risk level when the comprehensive risk evaluation score is not greater than the first risk threshold value;

determining the risk level of the tailings pond being the medium risk level when the comprehensive risk evaluation score is greater than the first risk threshold value and not greater than the second risk threshold value; and determining the risk level of the tailings pond being the high risk level when the comprehensive risk evaluation score is greater than the second risk threshold value.

6. The early warning method for safety production risk of tailings pond based on risk ranking as claimed in claim 1, wherein the early warning method for safety production risk of tailings pond based on risk ranking is implemented by a system, and the system comprises:

a basic data collection part, configured to monitor and collect the internal basic data of the tailings pond in real-time, and perform the basic monitoring and the basic early warning based on the internal basic data of the tailings pond;

an outer data collection part, configured to collect the geographical location data, the meteorological data, and the historical geological disaster data of the area where the tailings pond is located, and perform the risk ranking on the safety production risk of the tailings pond based on the meteorological data and the historical geological disaster data, thereby obtaining the risk level of the tailings pond; and the risk level being one of the low risk level, the medium risk level, or the high risk level; and a case collection part, configured to collect the case data of the global tailings pond accidents and the hazard degree data of the global tailings pond accidents, acquire the accident solution strategies for the global tailings pond accidents, perform the management and the monitoring on the tailings pond by combining the accident solution strategies with the risk level, and perform the ranked early warning on the safety production risk of the tailings pond based on the risk level.

7. The early warning method for safety production risk of tailings pond based on risk ranking as claimed in claim 6, wherein the basic data collection part comprises:

a data collection part, configured to collect the internal basic data in real-time; wherein the internal basic data comprises a geological structure of the tailings pond, an operation status of the tailings pond, a flood discharge capacity of the tailings pond, a phreatic line of the tailings pond, a dry beach length of the tailings pond, a water level of the tailings pond, and an external displacement of the tailings pond;

a comparison part, configured to compare each of internal basic data of the tailings pond with a corresponding data threshold value; and a monitoring early warning part, configured to perform the basic monitoring and the basic early warning when a quantitative relationship between the each of the internal basic data of the tailings pond and the corresponding data threshold values does not satisfy a preset safety monitoring relationship.

8. The early warning method for safety production risk of tailings pond based on risk ranking as claimed in claim 1, wherein the outer data collection part comprises:

a geographical location risk evaluation score acquiring part, configured to monitor and collect the geographical location data of the area where the tailings pond is located, and acquire the geographical location risk evaluation score by combining the geographical location data with the geographical location evaluation model;

a meteorological risk evaluation score acquiring part, configured to monitor and collect the meteorological data of the area where the tailings pond is located, and acquire the meteorological risk evaluation score by combining the meteorological data with the meteorological evaluation model;

a geological disaster risk evaluation score acquiring part, configured to collect the historical geological disaster data of the area where the tailings pond is located, and acquire the geological disaster risk evaluation score by combining the historical geological disaster data with the geological disaster evaluation model; and a risk level ranking part, configured to combine the geographical location risk evaluation score, the meteorological risk evaluation score, and the geological disaster risk evaluation score to obtain the risk level being the low risk level, the medium risk level, or the high risk level.

* * * * *